(12) United States Patent
Hayashi et al.

(10) Patent No.: US 7,800,805 B2
(45) Date of Patent: Sep. 21, 2010

(54) OPTICAL SCANNING APPARATUS AND IMAGE FORMING APPARATUS

(75) Inventors: Yoshinori Hayashi, Kanagawa (JP); Shunichi Sato, Miyagi (JP); Daisuke Ichii, Kanagawa (JP)

(73) Assignee: Ricoh Company, Limited, Tokyo (JP)

( * ) Notice: Subject to any disclaimer, the term of this patent is extended or adjusted under 35 U.S.C. 154(b) by 283 days.

(21) Appl. No.: 11/780,762

(22) Filed: Jul. 20, 2007

(65) Prior Publication Data
US 2008/0024849 A1    Jan. 31, 2008

(30) Foreign Application Priority Data
Jul. 24, 2006    (JP)    .............................. 2006-201252
Jul. 24, 2006    (JP)    .............................. 2006-201301

(51) Int. Cl.
G02B 26/08    (2006.01)
(52) U.S. Cl. .................................. 359/204.1; 347/130
(58) Field of Classification Search .............. 359/204.1, 359/204.2; 347/129, 130
See application file for complete search history.

(56) References Cited

U.S. PATENT DOCUMENTS

| | | | |
|---|---|---|---|
| 6,788,444 B2 | 9/2004 | Suzuki et al. | |
| 6,853,397 B2 * | 2/2005 | Onishi | ........................ 347/243 |
| 7,068,296 B2 | 6/2006 | Hayashi et al. | |
| 7,088,353 B2 * | 8/2006 | Fujii et al. | .................. 359/649 |
| 7,106,483 B2 | 9/2006 | Hayashi et al. | |
| 7,164,516 B2 | 1/2007 | Hayashi et al. | |
| 7,218,432 B2 | 5/2007 | Ichii et al. | |
| 7,253,937 B2 | 8/2007 | Ueda et al. | |
| 2002/0196377 A1 | 12/2002 | Furukawa et al. | |
| 2003/0067533 A1 | 4/2003 | Omori et al. | |
| 2003/0128268 A1 | 7/2003 | Kim | |
| 2005/0093955 A1 | 5/2005 | Izumi et al. | |
| 2006/0077500 A1 | 4/2006 | Hayashi et al. | |
| 2006/0232659 A1 | 10/2006 | Hayashi et al. | |
| 2006/0245009 A1 | 11/2006 | Akiyama et al. | |
| 2006/0284968 A1 | 12/2006 | Hayashi et al. | |
| 2007/0058255 A1 | 3/2007 | Imai et al. | |
| 2007/0064291 A1 | 3/2007 | Kashimura | |

FOREIGN PATENT DOCUMENTS

| | | |
|---|---|---|
| GB | 2 138 162 A | 10/1984 |
| JP | 2004-287292 | 10/2004 |
| JP | 2005-250319 | 9/2005 |
| WO | WO 2007/050086 A1 | 5/2007 |

OTHER PUBLICATIONS

U.S. Appl. No. 12/190,182, filed Aug. 12, 2008, Ichii et al.

* cited by examiner

*Primary Examiner*—Euncha P Cherry
(74) *Attorney, Agent, or Firm*—Oblon, Spivak, McClelland, Maier & Neustadt, L.L.P.

(57) ABSTRACT

In an optical scanning apparatus, when it is assumed that a scanning direction of light beams defected from a deflector is a main scanning direction, and a direction orthogonal to the main scanning direction and to optical axes of both a first and a second optical systems is a sub scanning direction, a distance between the outermost light emitting elements of a light source in the main scanning direction is longer than that in the sub scanning direction.

18 Claims, 11 Drawing Sheets

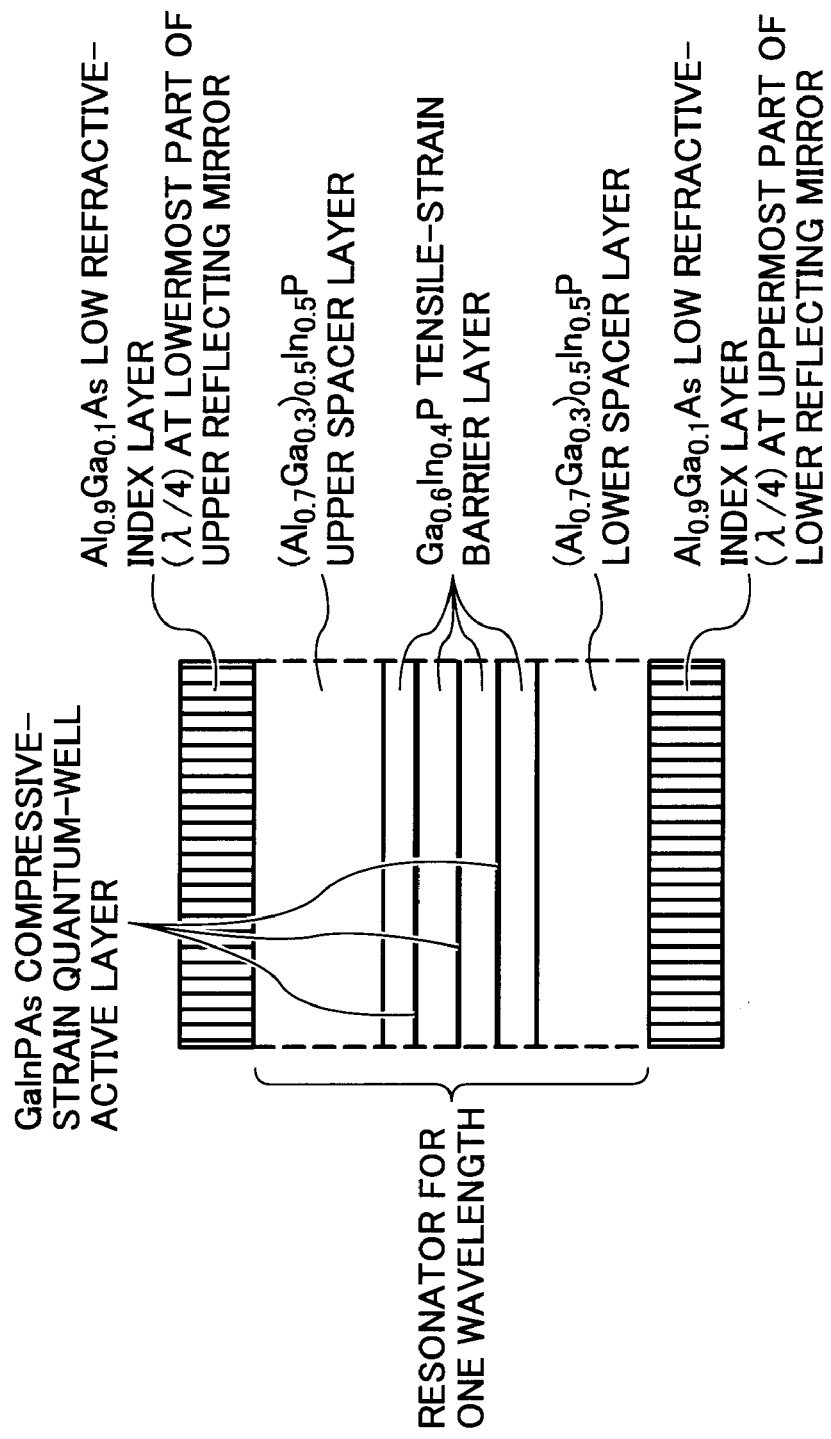

OPTICAL SCANNING APPARATUS AND IMAGE FORMING APPARATUS

CROSS-REFERENCE TO RELATED APPLICATIONS

The present application claims priority to and incorporates by reference the entire contents of Japanese priority documents, 2006-201252 filed in Japan on Jul. 24, 2006 and 2006-201301 filed in Japan on Jul. 24, 2006.

BACKGROUND OF THE INVENTION

1. Field of the Invention

The present invention relates to an optical scanning apparatus for used in an image forming apparatus.

2. Description of the Related Art

In image recording in an electrophotographic image forming apparatus, an image forming method using a laser has been widely used as an image forming unit that obtains high-definition image quality. In the case of the electrophotographic method, it is common to use a method in which a photosensitive drum is rotated (vertical scanning) to form a latent image, while scanning the laser (horizontal scanning) by using a polygon scanner (a rotary polygon mirror), which is one of deflectors, in an axial direction of an image carrier (for example, a photosensitive drum) having photosensitivity. In the technical field of electrophotography, there has been a requirement of forming images with higher density at higher speed. However, high density of images and image output speed are in a trade-off relationship, and balancing of both characteristics has been required.

As a method for balancing the high density of images and the image output speed, high speed rotation of a polygon scanner can be considered. However, it causes an increase in noise of the polygon scanner, an increase in power consumption, and deterioration of durability.

Therefore, as a method for preventing these problems, it is considered to use multi-beams of the light source, and there are methods as described below:

(1) a method of synthesizing optical beams from a plurality of light sources (for example, an end-face emitting semiconductor laser (LD)) (for example, see Japanese Patent Application Laid-open No. 2005-250319);

(2) a method of using an end-face emitting one-dimensional LD array in which a plurality of light emitting elements are arranged one-dimensionally; and (3) a method of using a surface-emitting two-dimensional LD array in which a plurality of light emitting elements are arranged two-dimensionally.

In the method of synthesizing the optical beams from the plurality of end-face emitting LDs, a general-purpose semiconductor laser (LD) can be used. Therefore, this method is economical; however, it is difficult to maintain relative positions between the LDs and a coupling lens stably by a plurality of optical beams, and an interval between scanning lines formed on a surface to be scanned by the multi-beams becomes nonuniform. Further, in this method, it is difficult to have many light sources, thereby making it difficult to achieve super high density and super high speed.

Further, in the method of using the end-face emitting one-dimensional LD array, the end-face emitting one-dimensional LD array can make the interval between scanning lines uniform; however, it has problems that the power consumption of the light emitting elements increases, and if the number of beams is radically increased, a deviation amount of beams from the optical axis of an optical element in an optical system increases, thereby deteriorating optical characteristic.

On the other hand, in the method of using the surface-emitting two-dimensional LD array, a surface-emitting laser (vertical-cavity surface-emitting laser: VCSEL) is a semiconductor laser (LD) that emits beams vertically relative to a substrate, and two-dimensional integration is easy. Further, the power consumption is smaller than the end-face emitting laser by one digit, and advantageous in two-dimensionally integrating more light sources. FIG. 13 is one example of arrangement of a conventional surface-emitting laser array. In this example, 32 light emitting elements are arranged in 8×4 matrix.

Related conventional techniques are disclosed in Japanese Patent Application Laid-Open Nos. 2005-250319 and 2004-287292, as an example of a write optical system that scans by using a polygon scanner, where a distance between outermost light sources in the main scanning direction is equal to or shorter than that in the sub scanning direction. At this time, it is necessary to reduce an absolute value of lateral magnification of the optical system in the sub scanning direction, to achieve the interval between high-density scanning lines on the surface to be scanned, thereby causing insufficient quantity of light. Particularly, in the case of the surface-emitting laser device, high output is a major issue, and it causes a serious problem. Further, to reduce the absolute value of lateral magnification of the whole optical system in the sub scanning direction, an optical element having a positive power in the sub scanning direction needs to be arranged at a position closest to the surface to be scanned of the scanning optical system, so that the optical element is brought close to the surface to be scanned. Therefore, the size of the optical element closest to the surface to be scanned increases, thereby causing a cost increase. Further, a housing for mounting the optical element increases, thereby causing a problem that a mechanical size increases. Furthermore, a space between the surface to be scanned and the scanning optical system becomes narrow, a toner amount in a developing unit that can be arranged in the image forming apparatus decreases, and therefore toner replacement needs to be performed frequently. A space for arranging units for executing an electrophotographic process required for image output, such as a charger, a transfer unit, a developing unit, and a fuser decreases, and the charger, the transfer unit, the developing unit, and the fuser need to be arranged on an opposite side of the scanning optical system, thereby increasing the mechanical size.

Further, as another method for reducing the absolute value of lateral magnification of the whole optical system in the sub scanning direction, there is a method of reducing the absolute value of lateral magnification of the optical system prior to a deflector in the sub scanning direction. At this time, however, an optical element for forming a line image (for example, a cylindrical lens) close to the deflector needs to be brought close to the deflector (the polygon scanner), thereby causing a problem that the optical element for forming the line image is affected by heat generation by the polygon scanner.

SUMMARY OF THE INVENTION

It is an object of the present invention to at least partially solve the problems in the conventional technology.

According to an aspect of the present invention there is provided an optical scanning apparatus including a light source including a two-dimensional array of light emitting elements, each light emitting element configured to emit a light beam; a first optical system that leads the light beams emitted from the light source to a deflector; and a second optical system that leads the light beams deflected from the deflector to a surface to be scanned. When it is assumed that a scanning direction of the light beams defected from the deflector is a main scanning direction and a direction orthogonal to the main scanning direction and to optical axes of both the first and the second optical systems is a sub scanning direction, a distance between the outermost light emitting elements in the main scanning direction is longer than that in the sub scanning direction.

According to another aspect of the present invention there is provided an optical scanning apparatus including a light source including a two-dimensional array of light emitting elements, each light emitting element configured to emit a light beam; a first optical system that leads the light beams emitted from the light source to a deflector; and a second optical system that leads the light beams deflected from the deflector to a surface to be scanned. The first optical system includes a coupling lens that couples the light beams emitted from the light source; and an anamorphic lens that converts the light beams from the coupling lens in a line image extending in a main scanning direction. A distance between outermost one of the light emitting elements in the main scanning direction is longer than that in a sub scanning direction, and the anamorphic lens has a positive power in the main scanning direction.

According to still another aspect of the present invention there is provided an optical scanning apparatus includes a light source including a two-dimensional array of light emitting elements, each light emitting element configured to emit a light beam; a first optical system that leads the light beams emitted from the light source to a deflector; and a second optical system that leads the light beams deflected from the deflector to a surface to be scanned. A distance between outermost of the light emitting elements in a main scanning direction is longer than that in a sub scanning direction. The first optical system includes a coupling lens that couples the light beams emitted from the light source; and an aperture that limits the optical beams emitted from the coupling lens in both the main scanning direction and the sub scanning direction, and a width of the aperture in the main scanning direction is larger than that in the sub scanning direction.

According to still another aspect of the present invention there is provided an image forming apparatus that forms images by using the above optical scanning apparatus.

According to still another aspect of the present invention there is provided an image forming apparatus that forms multicolor images by using the above optical scanning apparatus.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 5 is an enlarged view of the relevant parts around another example of the active layer;

FIG. 9A represents a problem such that opposite outermost beams on a polygon mirror are away from each other, and FIG. 9B depicts a state where this problem is corrected by a characteristic of an anamorphic lens;

DETAILED DESCRIPTION OF THE PREFERRED EMBODIMENTS

Exemplary embodiments of the present invention will be explained below in detail with reference to the accompanying drawings.

The configuration, operations, and operational effects of a first embodiment of the present invention are explained in detail with reference to the drawings.

Figure 1:
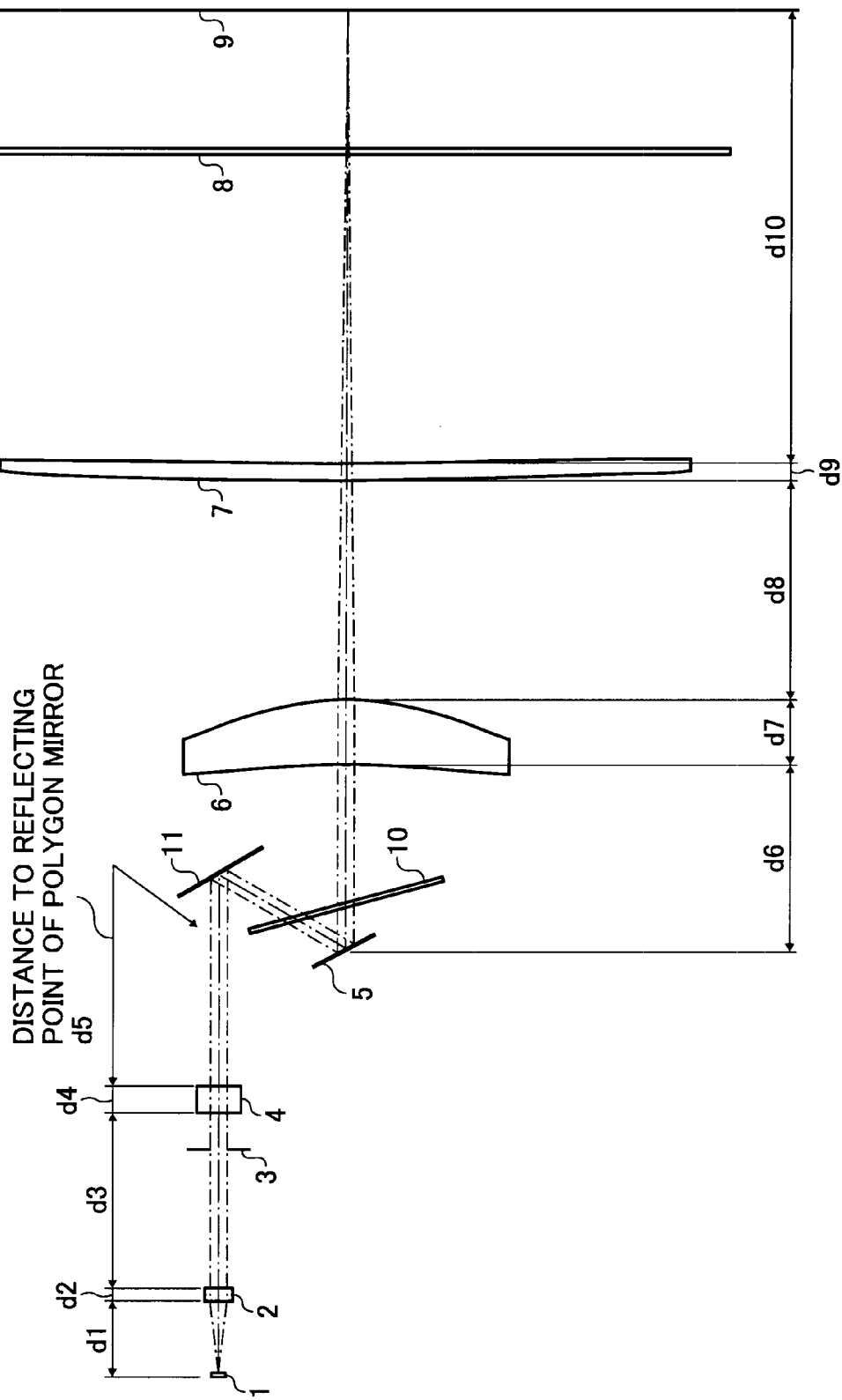
FIG. 1 is a schematic diagram of an example of basic configuration of an optical scanning apparatus according to one embodiment of the present invention.

FIG. 1 is a schematic configuration diagram of a basic configuration example of an optical scanning apparatus according to the present invention, and depicts an optical system constituting the optical scanning apparatus expanded on a plane (horizontal scanning plane or horizontal scanning cross-section) passing through an optical axis and parallel to the main scanning direction (a deflecting scanning direction by a deflector).

In FIG. 1, reference numeral 1 denotes a VCSEL array (an LD array) in which a plurality of light emitting elements is arranged two-dimensionally, 2 denotes a coupling lens, 3 denotes an aperture (opening), 4 denotes an anamorphic lens, 5 denotes a polygon mirror (only one deflection reflecting surface of the polygon mirror is shown in the drawing) of a polygon scanner (an optical deflector) as a deflector, 6 denotes a deflector side scanning lens, 7 denotes an image-surface side scanning lens, 8 denotes a dustproof glass, 9 denotes an image surface (a surface to be scanned), 10 denotes a soundproof glass, and 11 denotes a dummy mirror.

The beams emitted from the light source 1 are converted to weak divergent beams when they pass through the coupling lens 2. Those beams than pass through the aperture 3 and the anamorphic lens 4 where the beams are converted into parallel beams in the main scanning direction, and beams converging near the polygon mirror 5 in the sub scanning direction. The beams are then deflected by the polygon mirror 5, pass through the deflector side scanning lens 6, the image-surface side scanning lens 7, and the dustproof glass 8 so as to form an image on the image surface 9. The soundproof glass 10 is placed between the polygon mirror 5, which is the deflector, and the deflector side scanning lens 6. The light source 1 and the coupling lens 2 are fixed to a common holding member (not shown) made of aluminum.

Figure 3:
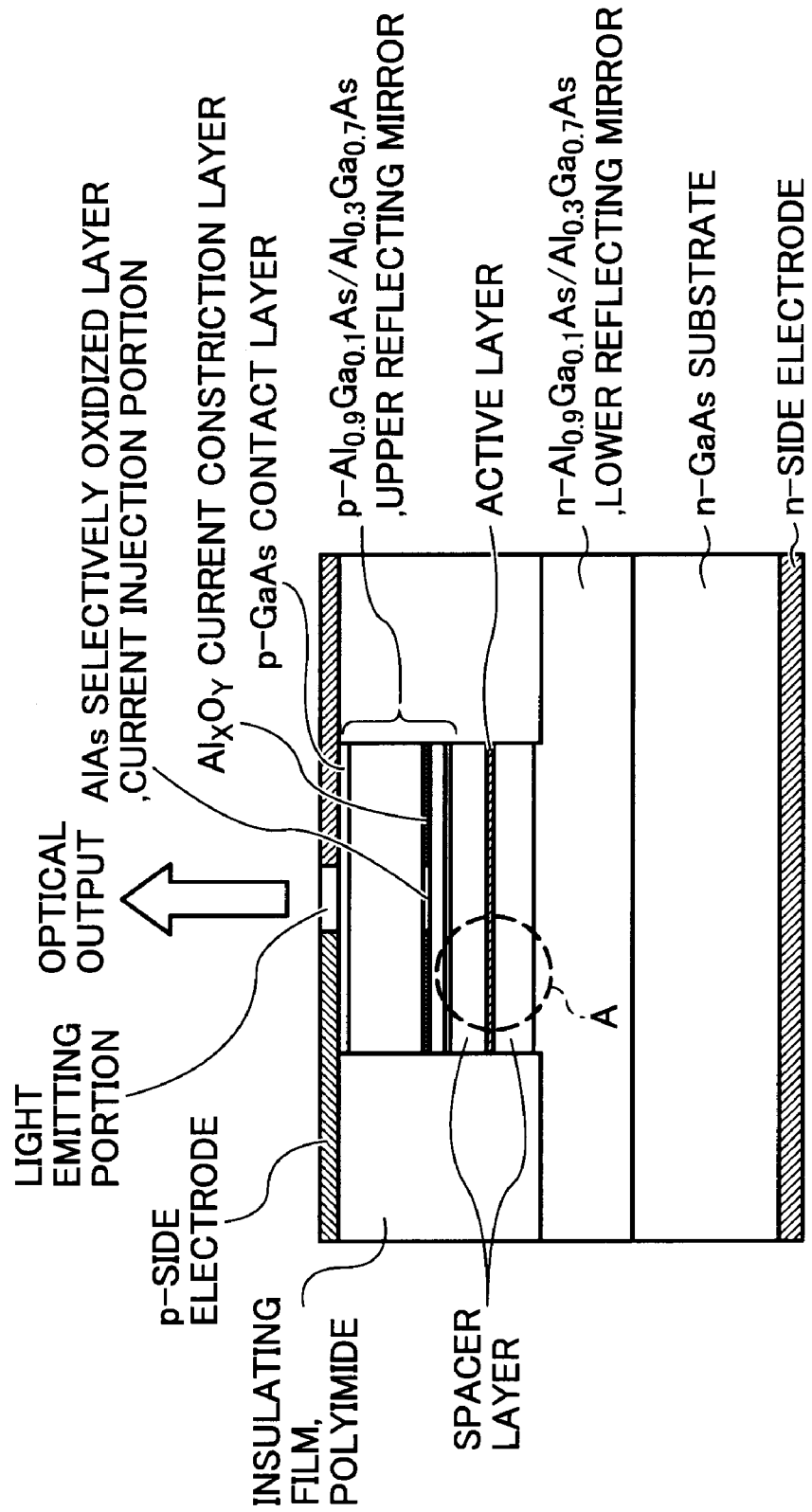
FIG. 3 is a cross section of a light emitting element (a surface emitting laser element) shown in FIG. 2.
Figure 4:
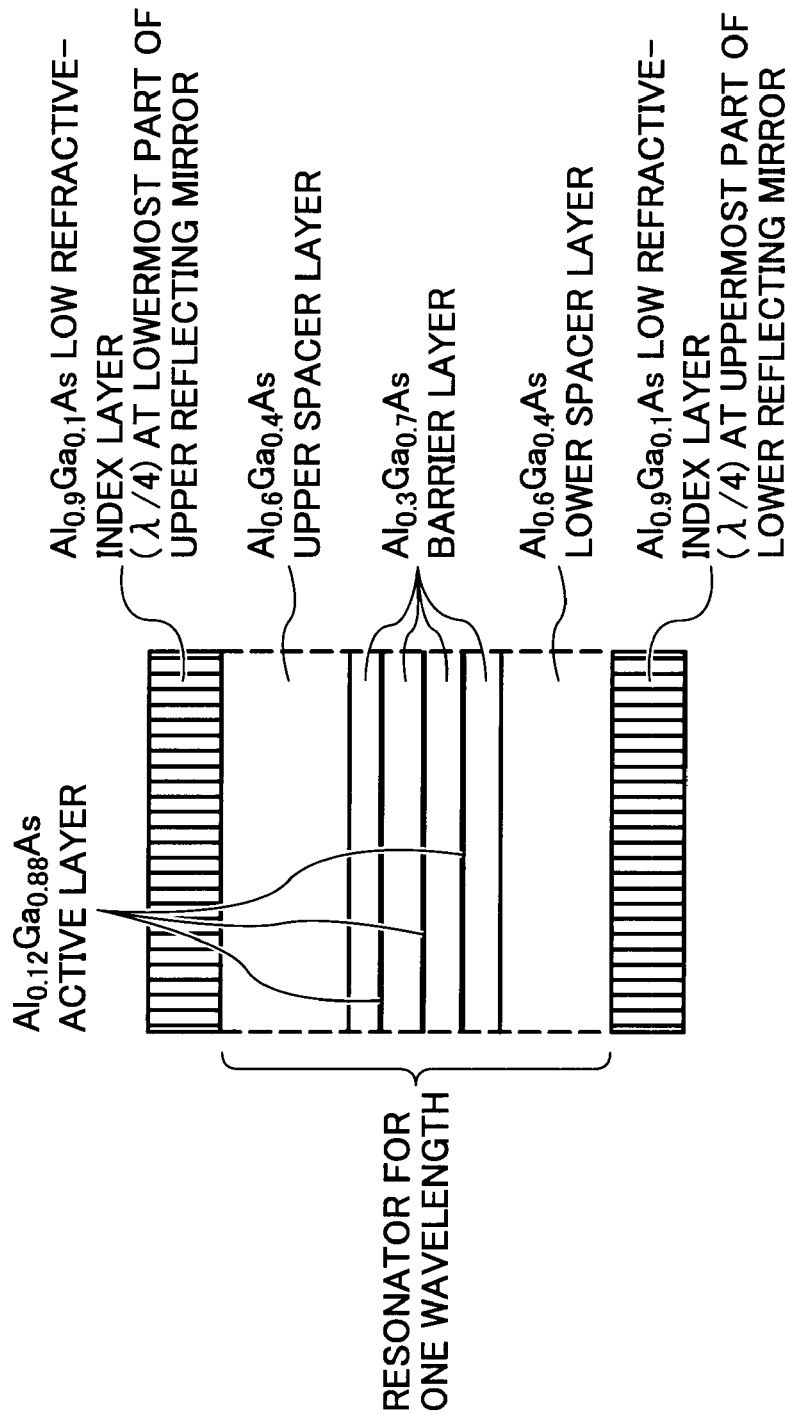
FIG. 4 is an enlarged view of relevant parts around an active layer, i.e. part A in FIG. 3.

The vertical-cavity surface-emitting LD array used as the light source of the optical scanning apparatus having the configuration as shown in FIG. 1 is, for example, a VCSEL having a wavelength of 780-nm band using a current constriction structure in which, for example, an AlAs layer is selectively oxidized. The wavelength can be selected, matched with a sensitivity characteristic of a photoconductor in the image forming apparatus. FIG. 3 is a schematic diagram of a cross-sectional structure of the light emitting element (the VCSEL device) constituting the vertical-cavity surface-emitting LD array. FIG. 4 is an enlarged diagram around an active layer (part A in the drawing) of the light emitting element shown in FIG. 3.

The VCSEL device having the cross-sectional structure as shown in FIG. 3 can be produced in the following manner.

The VCSEL device has such a configuration that a resonator area having an optical thickness of one wavelength formed of the active layer including $Al_{0.12}Ga_{0.88}As$ quantum-well layers and $Al_{0.3}Ga_{0.7}As$ barrier layers, and also including $Al_{0.6}Ga_{0.4}As$ spacer layers is put between a lower reflecting mirror formed of 40.5 pairs of n-$Al_{0.3}Ga_{0.7}As$ high refractive-index layer and n-$Al_{0.9}Ga_{0.1}As$ low refractive-index layer and an upper reflecting mirror formed of 24 pairs of p-$Al_{0.3}Ga_{0.7}As$ high refractive-index layer and p-$Al_{0.9}Ga_{0.1}As$ low refractive-index layer, respectively having an optical thickness of $\lambda/4$, on an n-GaAs substrate. An AlAs selectively oxidized layer is provided on the upper reflecting mirror away from the resonator area by $\lambda/4$. A composition inclination layer in which a composition gradually changes for reducing resistance is included between the respective layers of the reflecting mirror. A well-known Metal Organic Chemical Vapor Deposition (MOCVD) method or Molecular Beam Epitaxy (MBE) method can be used for crystal growth.

A mesa form is formed by dry etching. The etching face generally reaches the lower reflecting mirror. The AlAs selectively oxidized layer, whose sides are exposed by an etching process, is then heat-treated in water vapor to oxidize the periphery thereof, thereby changing the oxidized layer to an $Al_xO_y$ insulator layer, to form the current constriction structure that limits a route of an element driving current only to the nonoxidized AlAs area at a center. Subsequently, an $SiO_2$ protective layer (not shown) is provided, an etched portion is filled with polyimide and planarized, and polyimide and the $SiO_2$ protective layer (not shown) on the upper reflecting mirror having a p-contact layer and a light emitting portion are removed, to form a p-side individual electrode on a part other than the light emitting portion on the p-contact layer and form an n-side common electrode on the back side.

In the case of the first embodiment, a mesa section formed by dry etching becomes the respective light emitting elements (VCSEL devices). As a method for forming an arrangement of the two-dimensional array according to the present invention, a photomask along the array arrangement of the present invention is formed and an etching mask is formed by a general photolithographic process to perform etching. It is desired to provide a groove having a width equal to or larger than 5 micrometers between the devices for electrical and spatial separation of the respective devices in the array. This is because control of etching becomes difficult if the width of the groove becomes too narrow. The mesa section can be formed in an arbitrary shape such as elliptical, square, or rectangular shape, other than a circular shape in the first embodiment. It is desired that the size (the diameter) of the mesa section is equal to or larger than 10 micrometers. This is because if the mesa section is too small, the heat is confined at the time of a device operation, thereby deteriorating the characteristic.

Figure 2:
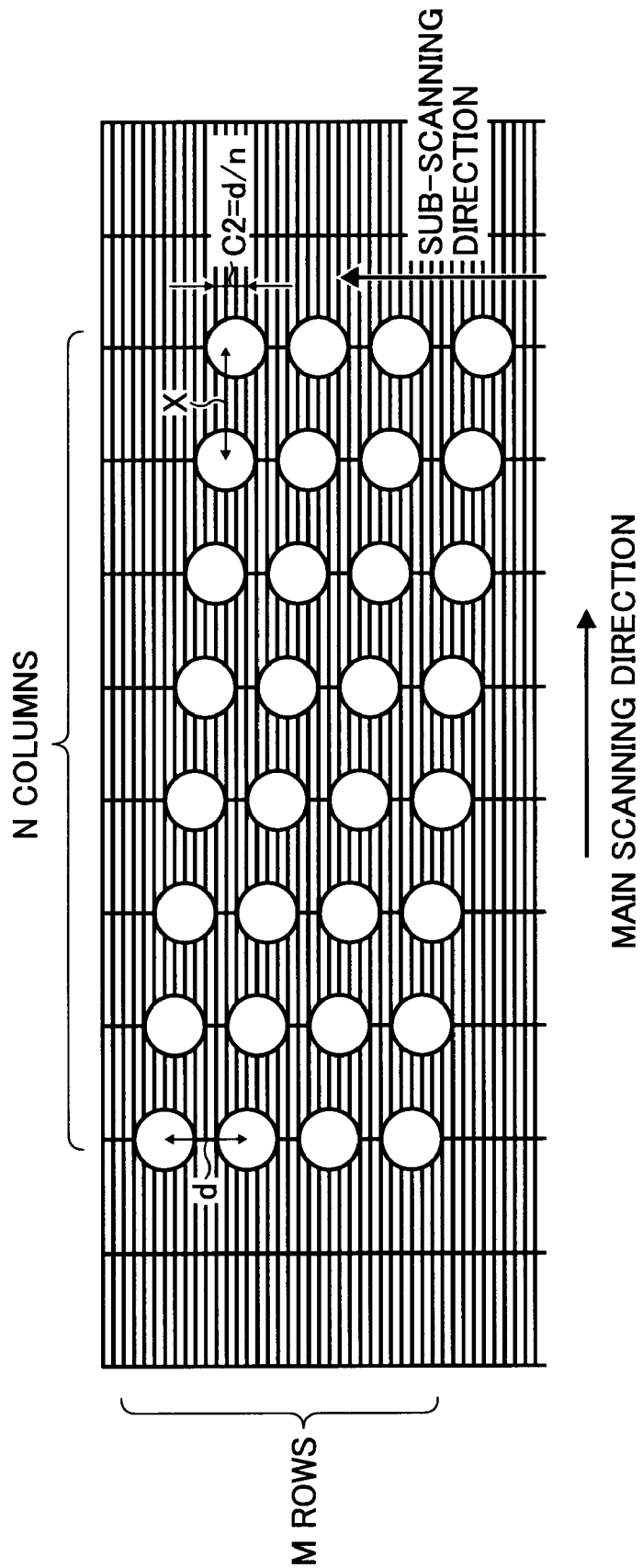
FIG. 2 is a schematic plan view of an example of arrangement of light emitting elements in a surface-emitting laser array according to the present invention.

The array arrangement of the light emitting elements in the light source 1 in the first embodiment is, for example as shown in FIG. 2, 4×8 arrays of 4 rows and 8 columns (white circles in the drawing are light emitting elements (light emitting points)). The light emitting elements are arranged at equal interval d in the sub scanning direction, and two adjacent light emitting elements in the main scanning direction are displaced by equal interval $C2=d/n$ in the sub scanning direction. The light emitting elements are arranged at equal interval X in the main scanning direction. Specifically, when d is 18.4 micrometers and X is 30 micrometers, $C2=2.3$ μm.

Figure 13:
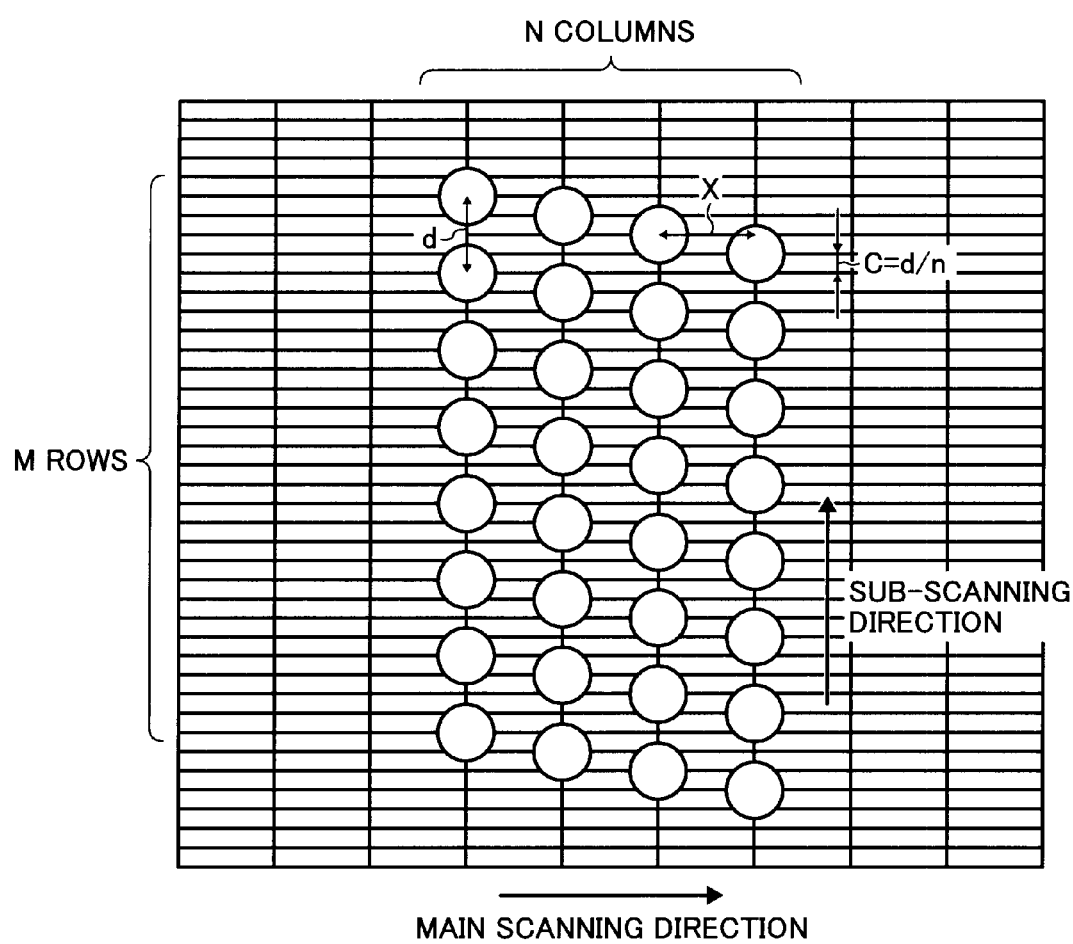
FIG. 13 is a schematic plan view of an example of arrangement of light emitting elements in a conventional surface-emitting laser array.

When the intervals d and X between devices in the first embodiment are applied to the array arrangement of a conventional example in FIG. 13, because $C=d/n=4.6$ micrometers, an interval C2 between respective devices in the sub scanning direction when a perpendicular is drawn in the sub scanning direction from the center of the respective devices in the array in the first embodiment shown in FIG. 2 is 50% of C in FIG. 13. Hence, it is seen that even if the intervals between devices in plane are the same, the density becomes high according to the present invention. The intervals d and X between devices need to be determined, taking into consideration an influence of thermal interference from other devices in the array at the time of an operation, as well as the limitation on a manufacturing process.

Further, because the intervals between devices in the main scanning direction, which does not affect high density in the sub scanning direction, is enlarged, a space required for reducing the influence of thermal interference between respective devices and wiring of respective devices can be ensured.

Note that the 780-nm-band VCSEL device can be produced from other materials. FIG. 5 is an enlarged diagram around the active layer of the device. As shown in FIG. 5, the active layer is formed of a three-layer GaInPAs quantum-well active layer, having a compressive strain composition and a band gap wavelength of 780 nanometers, and a lattice-matched four-layer $Ga_{0.6}In_{0.4}P$ barrier layer having a tensile strain, and $(Al_{0.7}Ga_{0.3})_{0.5}In_{0.5}P$, which is a wide band gap, is used as a cladding layer (the spacer layer in the first embodiment) for electron confinement. A difference in the band gap between the cladding layer and the quantum-well active layer can be made remarkably large, as compared with a case that the cladding layer for carrier confinement is formed of an AlGaAs system. The other configurations are the same as those shown in FIG. 4.

In Table 1 is shown the band gap difference between the spacer layer and the well layer, and between the barrier layer and the well layer in a representative material composition of the 780-nm and 850-nm VCSEL of AlGaAs (spacer layer)/AlGaAs (quantum-well active layer) system and the 780-nm VCSEL of AlGaInP (spacer layer)/GaInPAs (quantum-well active layer) system. The spacer layer stands for a layer between the active layer and the reflecting mirror in a normal configuration and having a function of the cladding layer for carrier confinement.

As shown in Table 1, according to the 780-nm VCSEL of AlGaInP (spacer layer)/GaInPAs (quantum-well active layer) system, it is seen that a larger band gap difference can be ensured not only than the 780-nm VCSEL of AlGaAs/AlGaAs system but also than the 850-nm VCSEL of AlGaAs/AlGaAs system.

Specifically, the band gap difference between the cladding layer and the active layer is as large as 473 meV, as compared with 466 meV (in the case of Al composition: 0.6) when the cladding layer is formed of AlGaAs. There is also a dominant difference in the band gap difference between the barrier layer and the active layer, thereby realizing favorable carrier confinement.

TABLE 1

Band gap difference according to respective wavelengths and material systems

| | Wavelength 780 nm | | |
|---|---|---|---|
| | Spacer layer/Quantum-well active layer AlGaAs/AlGaAs system material | AlGaInP/GaInPAs system material | 850 nm (Ref.) AlGaAs/GaAs system material |
| Spacer layer | $Al_{0.6}Ga_{0.3}As$ (Eg = 2.0226 eV) | $(Al_xGa_{1-x})_{0.5}In_{0.5}P$ (Eg (x = 0.7) = 2.289 eV) | $Al_{0.6}Ga_{0.4}As$ (Eg = 2.0226 eV) |
| Active layer Quantum-well active layer | $Al_{0.12}Ga_{0.88}As$ (Eg = 1.5567 eV) | GaInPAs (Compressive strain) (Eg = 1.5567 eV) | GaAs Eg = 1.42 eV |
| Barrier layer | $Al_{0.3}Ga_{0.7}As$ (Eg = 1.7755 eV) | $Ga_xIn_{1-x}P$ (Tensile strain) (Eg (x = 0.6) = 2.02 eV) | $Al_{0.3}Ga_{0.7}As$ (Eg = 1.7755 eV) |
| Eg difference between spacer layer and well layer ($\Delta$Eg) | 465.9 meV | 743.3 meV | 602.6 meV |
| Eg difference between barrier layer and well layer ($\Delta$Eg) | 218.8 meV | 463.3 meV | 355.5 meV |

Because the active layer has the compressive strain, a gain increases due to band separation between heavy-hole and light-hole bands, thereby realizing high gain, low threshold, and high output. This effect cannot be obtained by the 780-nm or 850-nm VCSEL manufactured from the AlGaAs system having substantially the same lattice constant as that of the GaAs substrate.

Further, reflectivity of a DBR on a light-taking out improvement of carrier confinement and the high gain by the strained quantum-well active layer, thereby realizing higher output.

When the gain increases as in the first embodiment, a decrease in light output due to temperature rise can be suppressed and the interval of the devices in the array can be made narrower.

Because the active layer and the barrier layer are formed of a material not including Al to form an AL-free active area (the quantum-well active layer and a layer adjacent thereto), formation of a non-radiative recombination center can be suppressed by decreasing oxygen uptake, thereby realizing long life of the apparatus. Accordingly, a write unit or a light source unit can be reused.

As shown in FIG. 13, in the two-dimensional arrangement of the conventional VCSEL array, four columns are arranged in the main scanning direction and eight rows are arranged in the sub scanning direction. Accordingly, a distance between the outermost light emitting elements in the main scanning direction is $(n-1) \times X = 3X$ (n=4), a distance between the outermost light emitting elements in the sub scanning direction is $(m-1) \times d = 7d$ (m=8), and they are represented as $7d > 3X$.

At this time, the pitch of the scanning line intervals on the surface to be scanned becomes $|\beta s| \times d/4$, thereby making it difficult to obtain a desired pitch in the case of handling high density. For example, in the case of 2400 dots per inch (dpi), $$25.4 \text{ mm}/2400 = 10.6 \text{ }\mu\text{m},$$

in the case of 4800 dpi, $$25.4 \text{ mm}/48000 = 5.3 \text{ }\mu\text{m},$$

however, $|\beta s| \times d/n$ needs to be set to the same value of the pitch.

First and second means for solving the problem is explained with reference to FIG. 2. FIG. 2 is a schematic plan view of the arrangement of the light emitting elements in the VCSEL array of the present invention, depicting an example in which the horizontal scanning pitch X is longer than the vertical scanning pitch d, and the number of arrays is different in the main scanning direction and the sub scanning direction. As shown in FIG. 2, eight columns are arranged in the main scanning direction and four rows are arranged in the sub scanning direction. Therefore, the distance between the outermost light sources in the main scanning direction is $(n-1) \times$ X=7X (n=8), a distance between the outermost light sources in the sub scanning direction is (m−1)×d=3d (m=4), and they are represented as 7X>3d.

Therefore, the distance between the outermost light emitting elements in the main scanning direction becomes longer than that in the sub scanning direction.

At this time, the pitch of the scanning line intervals on the surface to be scanned becomes |βs|×d/7, thereby making it easier to obtain the desired pitch in the case of handling high density, as compared with the conventional example. In other words, handling of the high density becomes easy by making the distance between the outermost light emitting elements in the main scanning direction longer than that in the sub scanning direction.

Further, the pitch on the surface to be scanned can be decreased, thereby facilitating the handling of the high density, by setting an absolute value |βs| of lateral magnification of the whole optical system in the sub scanning direction to a smaller value than an absolute value |βm| of lateral magnification in the main scanning direction (|βm|>|βs|).

There can be considered a method in which the distance between the outermost light emitting elements in the main scanning direction is made shorter than that in the sub scanning direction to decrease |βs|. However, various problems described above including a decrease of efficiency for light utilization occur, and therefore this method is not preferable.

Third means is formed such that, in addition to the configuration of the first and the second means, in the light source 1 in which a plurality of light emitting elements is arranged two-dimensionally, m light emitting elements (in the example in FIG. 2, m=4) are one-dimensionally arranged in the sub scanning direction, and vertically one-dimensional rows are arranged in n (in the example in FIG. 2, n=8) approximately in the main scanning direction, and a positional relationship of respective light emitting elements in the sub scanning direction becomes equal intervals, when a perpendicular is drawn from m×n light emitting elements (m≦n) to a straight line parallel to the sub scanning direction. By regulating the configuration of the first means by a relationship between the number of columns and the number of rows of the light emitting elements, the same effect as described above can be obtained.

As described above, how to decrease the scanning line intervals on the surface to be scanned is a major issue. In the optical scanning apparatus as fourth means, in addition to the configuration of the third means, in the light source in which a plurality of light emitting elements is arranged two-dimensionally, when it is assumed that an arrangement pitch of the light emitting elements in a vertical scanning one-dimensional m-array is d, and an arrangement pitch thereof in a horizontal scanning n-array is X, by setting X>d, the device intervals in the main scanning direction, which does not affect the high density in the sub scanning direction, are enlarged, thereby reducing the influence of thermal interference between respective devices and ensuring the space required for wiring between respective devices.

In the optical scanning apparatus as fifth means, in addition to the above configuration, the first optical system has the coupling lens 2 that couples a plurality of optical beams emitted from the light source 1, and an opening (for example, an aperture) 3 that limits the beams at least in the main scanning direction relative to the optical beams emitted from the coupling lens 2, and the opening 3 is arranged at a position closer to the deflector (for example, a polygon mirror) 5 rather than at a rear focal position of the coupling lens 2.

The optical scanning apparatus is explained with reference to FIGS. 6A and 6B. In both drawings, an arrangement of the optical system in the horizontal scanning cross section is shown.

Figure 6A:
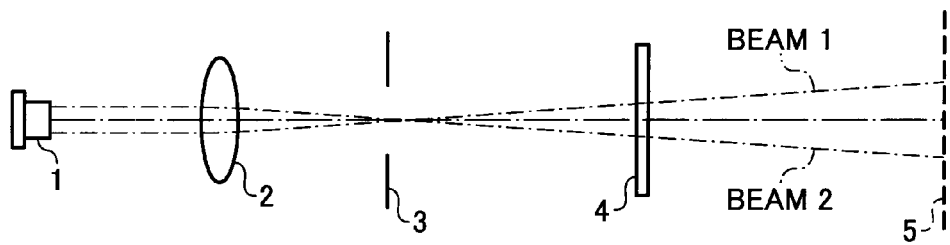
FIGS. 6A and 6B are schematic diagrams for explaining positional relationship between a coupling lens and an aperture in the optical scanning apparatus shown in FIG. 1.
Figure 6B:
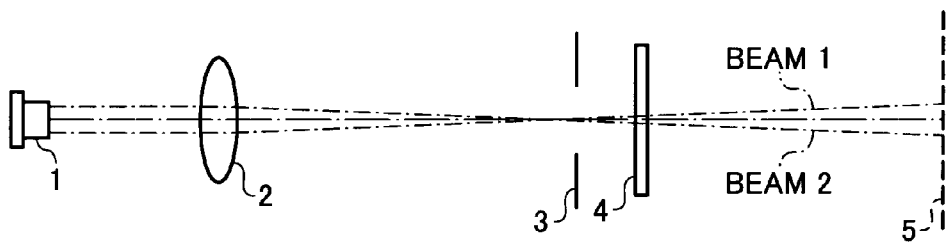

FIG. 6A is a schematic diagram for explaining a case when the aperture 3 is arranged at the rear focal position of the coupling lens 2. If the configuration of the first to the fourth means is adopted, the distance between the outermost light emitting elements in the main scanning direction increases. In this case, if the aperture 3 that limits the beams in the main scanning direction is arranged at the rear focal position of the coupling lens 2, as shown in the drawing, the beams are separated from each other on the polygon mirror face. Particularly, the optical characteristic of the outermost beams deteriorates. In this configuration, the most important characteristic is to obtain the desired scanning line intervals on the surface to be scanned. Even if the aperture 3 is arranged at the rear focal position of the coupling lens 2, the optical scanning apparatus capable of realizing high image quality, high density, and high speed can be obtained. However, to further improve the characteristic of horizontal scanning and vertical scanning beam spot diameters, the configuration as shown in FIG. 6B needs only to be adopted. That is, the aperture 3 is arranged at a position closer to the deflector (the polygon mirror) 5 than the rear focal position of the coupling lens 2. At this time, the center-line distance of the outermost beams on the polygon mirror face becomes short, thereby improving field curvature in the horizontal scanning and the vertical scanning, and enabling acquisition of favorable beam spot diameters both in the horizontal scanning and the vertical scanning.

Figure 7:
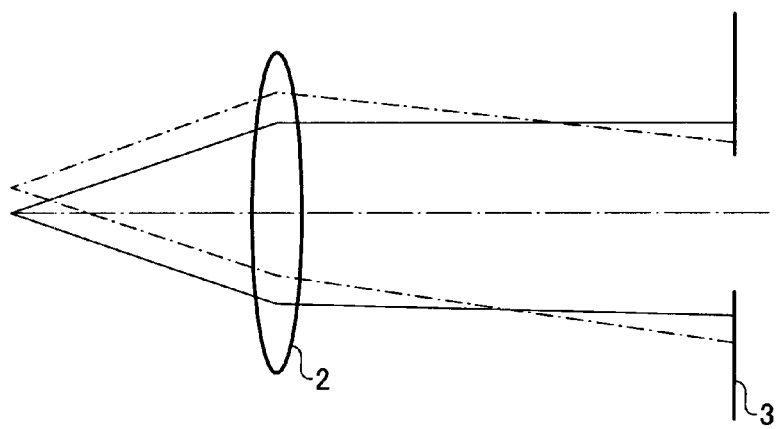
FIG. 7 is a schematic diagram for explaining misregistration of beams from a central light emitting element and beams from an outermost light emitting element relative to a center of the aperture.

In the optical scanning apparatus as sixth means, in addition to the above configuration, at least one of the outermost light emitting elements, of the light emitting elements arranged two-dimensionally, increases a light emitting amount than that of the light emitting elements located at positions other than the outermost positions, thereby enabling suppression of a decrease in the quantity of light of the outermost beams. In other words, as shown in FIG. 7, when the light source 1 in which a plurality of light emitting elements is arranged two-dimensionally is used, in the optical beam at the outermost position, the center of the beam does not agree with the center of the aperture 3. Therefore, the efficiency for light utilization of the peripheral beams decreases relative to the central beams. Accordingly, by increasing the light emitting amount of the outermost light emitting elements to set the quantity of light of the outermost beams high, an optical scanning apparatus having no density difference can be realized.

In the optical scanning apparatus as seventh means, in addition to the above configuration, the first optical system has the coupling lens 2 that couples a plurality of optical beams emitted from the light source 1, and an opening (for example, an aperture) that limits the beams in the horizontal scanning and sub scanning directions relative to the optical beams emitted from the coupling lens 2, and the width of the aperture 3 in the main scanning direction is larger than that of the aperture 3 in the sub scanning direction.

Figure 8A:
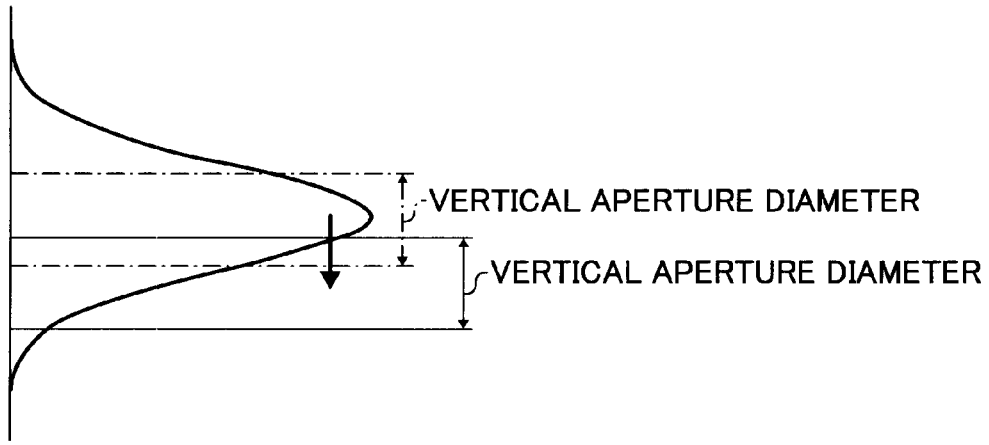
FIGS. 8A and 8B are charts indicating a case that an aperture diameter in the main scanning direction is larger than that in the sub scanning direction, assuming that deviation amounts of an optical axis from the coupling lens are the same in the horizontal and sub scanning directions.
Figure 8B:
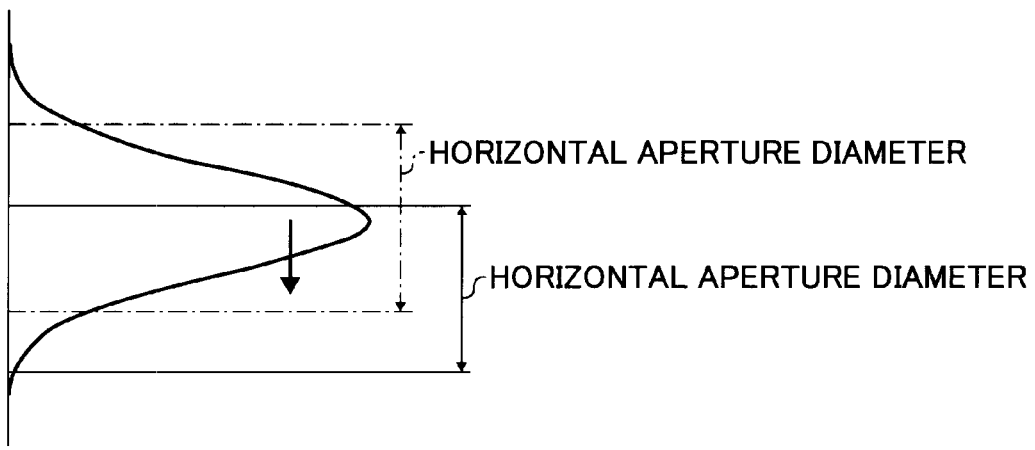

In the configurations of the first to the fourth means, an optical axis deviation amount of the outermost beams from the coupling lens increases in the main scanning direction than in the sub scanning direction. However, if the aperture diameter for restricting the beams in the sub scanning direction is larger than that in the main scanning direction, a difference in the quantity of light increases. FIGS. 8A and 8B depict a case that the optical axis deviation amounts from the coupling lens are the same in the horizontal scanning and sub scanning directions, and the aperture diameter in the main scanning direction (horizontal aperture diameter in FIG. 8B) is larger than that in the sub scanning direction (vertical aperture diameter in FIG. 8A). At this time, as can be understood from FIGS. 8A and 8B, as the aperture diameter increases, a rate of change in the quantity of light relative to the optical axis deviation decreases. Therefore, the aperture diameter in the main scanning direction having a large optical axis deviation needs to be set larger than that in the sub scanning direction. Further, to make the lateral magnification in the sub scanning direction smaller than that in the main scanning direction, it is necessary to increase the aperture diameter in the main scanning direction/aperture diameter in the sub scanning direction, and in this sense, the significance of the configuration of the seventh means is large.

As explained in the first and the second means, the conventional two-dimensional LD array is arranged in four columns in the main scanning direction and eight rows in the sub scanning direction. Therefore, the distance between the outermost light sources in the main scanning direction becomes $(n-1) \times X = 3X$ (n=4), the distance between the outermost light sources in the sub scanning direction becomes $(m-1) \times d = 7d$ (m=8), and they are represented as 7d>3X.

At this time, if it is assumed that the lateral magnification in the sub scanning direction of the whole optical system is βs, the pitch of the scanning line intervals on the surface to be scanned becomes |βs|×d/4, thereby making it difficult to obtain a desired pitch in the case of handling high density.

For example, in the case of 2400 dpi, 25.4/2400=10.6 micrometers, and in the case of 4800 dpi, 25.4/48000=5.3 micrometers; however, |βs|×d/n needs to be set to the same value of the pitch.

One of the means for solving this problem is explained with reference to FIG. 2. As shown in FIG. 2, the arrangement is eight columns in the main scanning direction and four rows in the sub scanning direction. Therefore, the distance between the outermost light sources in the main scanning direction is $(n-1) \times X = 7X$ (n=8), the distance between the outermost light sources in the sub scanning direction is $(m-1) \times d = 3d$ (m=4), and they are represented as 7X>3d.

Therefore, the distance between the outermost light sources in the main scanning direction becomes longer than that in the sub scanning direction. At this time, the pitch of the scanning line intervals on the surface to be scanned becomes |βs|×d/7, thereby making it easier to obtain the desired pitch in the case of handling high density, as compared with the conventional example.

In other words, handling of the high density becomes easy by making the distance between the outermost light sources in the main scanning direction longer than that in the sub scanning direction. However, the distance between the outermost light sources in the main scanning direction increases.

Figure 9A:
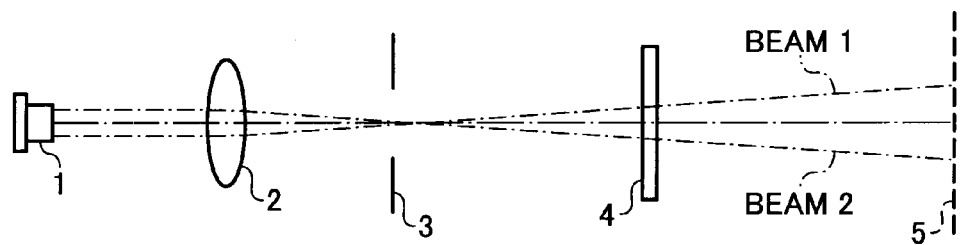
FIGS. 9A and 9B depict a beam state when a distance between outermost light sources in the main scanning direction is made longer than that between outermost light sources in the sub scanning direction, where

At this time, as shown in FIG. 9A, opposite outermost beams are away from each other on the polygon mirror face, and it becomes difficult to obtain favorable beam spot diameter in the horizontal scanning and sub scanning directions relative to all the beams.

Figure 9B:
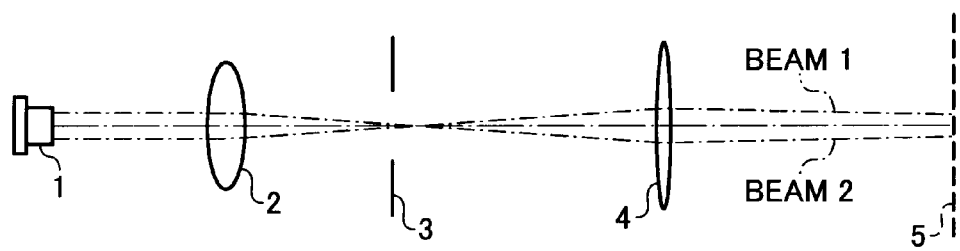

Therefore, as shown in FIG. 9B, if the anamorphic lens 4 has positive power in the main scanning direction, the distance between the outermost beams on the polygon mirror face becomes short, and therefore favorable optical characteristic can be obtained in the horizontal scanning and sub scanning directions.

As described above, to achieve high density in the sub scanning direction, it is effective to set the distance between the outermost beams in the main scanning direction longer than that in the sub scanning direction.

At this time, if the aperture diameter for restricting the beams in the sub scanning direction is larger than that in the main scanning direction, a difference in the quantity of light increases. FIGS. 8A and 8B depict a case that the optical axis deviation amounts from the coupling lens are the same in the horizontal scanning and sub scanning directions, and the aperture diameter in the main scanning direction (the horizontal aperture diameter) is larger than that in the sub scanning direction (the vertical aperture diameter). At this time, as seen from these drawings, as the aperture diameter increases, a rate of change in the quantity of light (reduced quantity) relative to the optical axis deviation decreases. Therefore, the aperture diameter in the main scanning direction having a large optical axis deviation needs to be set larger than that in the sub scanning direction.

As shown in FIG. 7, the center of the beam at the outermost position does not agree with the center of the aperture 3. Therefore, the efficiency for light utilization of the peripheral beams decreases relative to the central beams. Accordingly, by setting the quantity of light of the outermost beams high, an optical scanning apparatus having no density difference can be realized.

A configuration example of the image forming apparatus using the optical scanning apparatus according to a second embodiment of the present invention is explained next with reference to FIG. 10. The image forming apparatus shown in FIG. 10 includes a cylindrical photosensitive drum 111 as an image carrier, and also includes, around the photosensitive drum 111, a charger 112 for uniformly charging a surface of the photoconductor (in FIG. 10, the one having a contact type by a charging roller is shown, however, a charging brush, a non-contact type corona charger, and the like can be used other than the charging roller), an optical scanning apparatus 113 that irradiates optical beams to the photosensitive drum to form an electrostatic latent image (the optical scanning apparatus explained in the first embodiment is applied), a development apparatus 114 that develops the electrostatic latent image on the photosensitive drum by a toner, a transfer apparatus 115 that transfers a toner image manifested on the photosensitive drum by development onto a sheet recording medium S (a transfer roller is shown in the drawing, however, the one using the corona charger and the like can be used), and a cleaning apparatus 116 that removes a transfer residual toner after transfer. Reference numeral 117 denotes a fuser.

A photosensitive layer formed of a photoconductor material having photoconductivity, which becomes a derivative in the dark and becomes a conductor when irradiated with light, is provided on a cylindrical external surface of the photosensitive drum 111, having conductivity such as a grounded metal.

Figure 10:
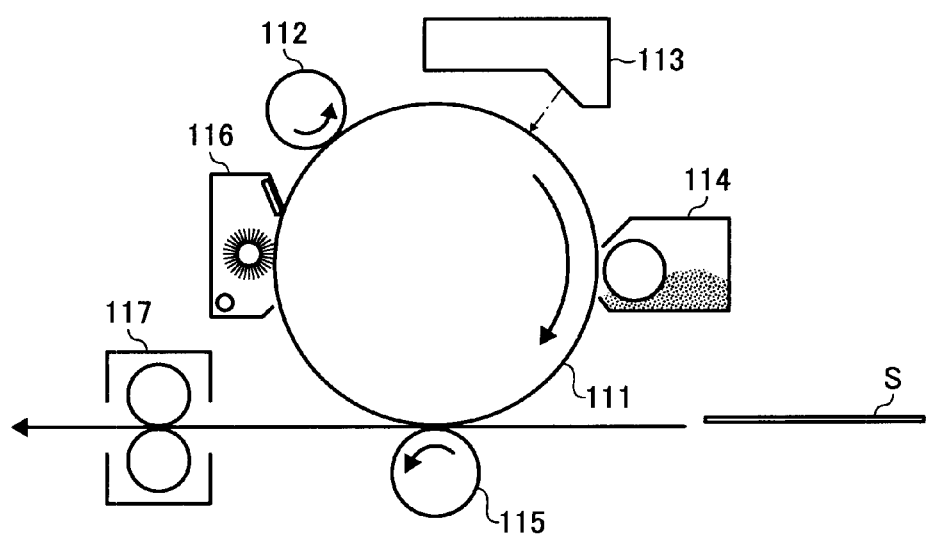
FIG. 10 is a schematic diagram of relevant parts of an exemplary image forming apparatus according to another embodiment of the present invention.

The photosensitive drum 111 is rotated at constant speed in direction of arrow in FIG. 10, and a charge is uniformly provided on the surface of the photoconductor by the charger 112.

The optical beams, with strength being modulated, is irradiated onto a part of the photosensitive drum 111 by the optical scanning apparatus 113 corresponding to image information. The part of the photosensitive drum 111 where the optical beams are exposed becomes a conductor, and because the charge on the surface of the photoconductor is released via the cylinder having the conductivity, the charge on the surface of the photoconductor disappears. The charge on a part where the optical beams are not exposed is held as it is. In this manner, the electrostatic latent image is formed on the surface of the photoconductor.

The toner charged to the charge of the same polarity as that of the surface of the photoconductor by the development apparatus 114 adheres only to the part where the charge on the surface of the photoconductor disappears, to form a visible image as the toner image.

The toner image on the photoconductor is transferred from a paper feeder (not shown) onto the sheet recording medium S such as recording paper or an overhead projector (OHP) sheet fed by the transfer apparatus 114 using an electrostatic force and pressure. The toner image transferred onto the sheet recording medium S is fixed by applying heat and pressure by the fuser 117. The sheet recording medium S on which the toner image is fixed is ejected to a paper ejector (not shown) outside of the apparatus. The photosensitive drum 111 after the transfer of the toner image is cleaned by a cleaning member (a blade, a brush, and the like) in the cleaning apparatus 116, thereby removing residual toner and paper dust.

In the image forming apparatus having the configuration shown in FIGS. 9A and 9B, an image is formed through processes of charging, exposure, development, transfer, fixation, and cleaning. However, by using the optical scanning apparatus according to the present invention explained in the first embodiment as the optical scanning apparatus 113, the image forming apparatus that can handle high density and high speed can be realized.

Figure 11:
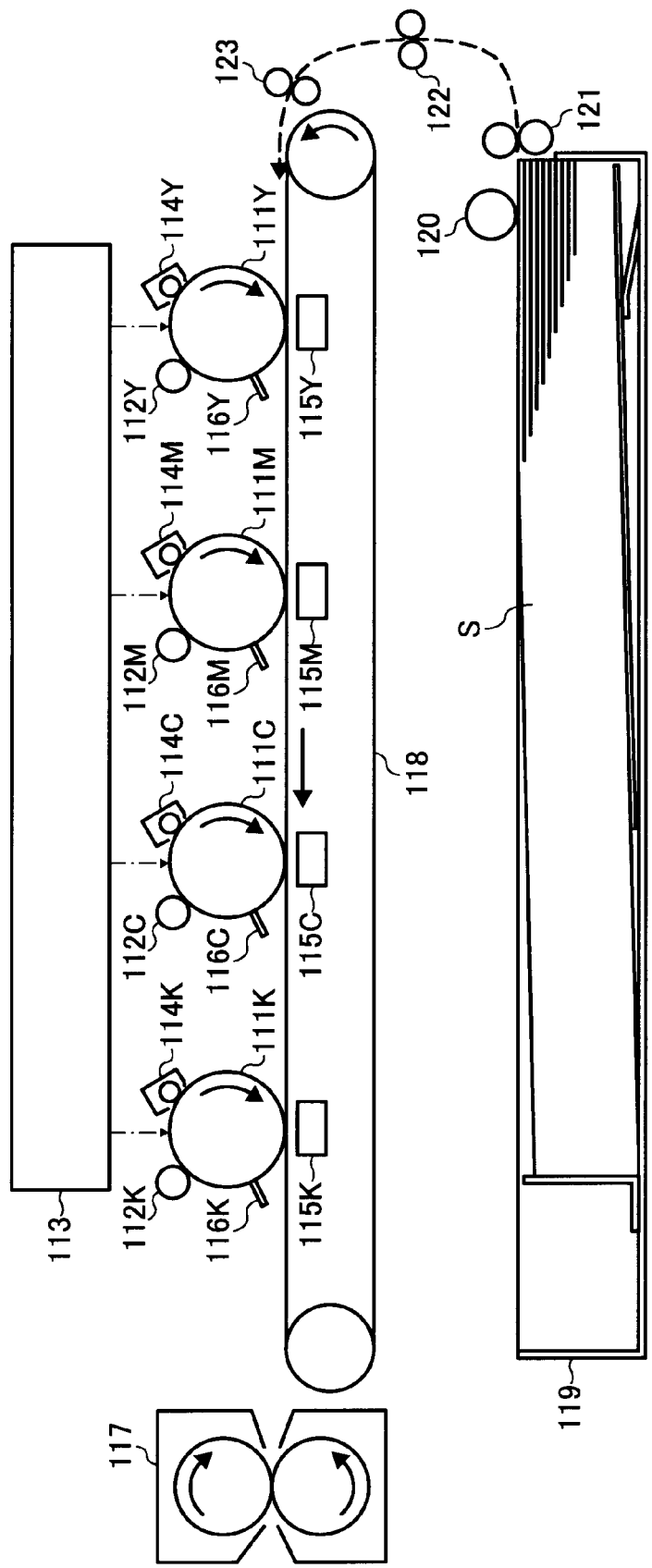
FIG. 11 is a schematic diagram of relevant parts of an exemplary multicolor image forming apparatus according to another embodiment of the present invention.

A configuration example of a multicolor image forming apparatus using the optical scanning apparatus according to a third embodiment of the present invention is shown in FIG. 11. Reference characters 111Y, 111M, 111C, and 111K in FIG. 11 denote photosensitive drums arranged in parallel along a transfer belt 118, which are rotated in a direction of arrow in FIG. 11. Chargers 112Y, 112M, 112C, and 112K (in FIG. 11, a contact type charging roller is shown, however, a charging brush, a non-contact type corona charger, and the like can be used other than the charging roller), the optical scanning apparatus 113 (the optical scanning apparatus explained in the first embodiment is applied), development apparatuses 114Y, 114M, 114C, and 114K for the respective colors, transfer apparatuses (a transfer charger, a transfer roller, a transfer brush, or the like) 115Y, 115M, 115C, and 115K, and cleaning apparatuses 116Y, 116M, 116C, and 116K are arranged around the respective photosensitive drums 111Y, 111M, 111C, and 111K as in FIG. 10. Reference numeral 117 in FIG. 11 denotes a fuser, 119 denotes a paper feed cassette loaded with the sheet recording medium S such as the recording paper, 120 denotes a paper feed roller, 121 denotes a separation roller pair, 122 denotes a carrier roller pair, and 123 denotes a registration roller pair.

The optical beams are exposed on the respective photosensitive drums 111Y, 111M, 111C, and 111K, with the strength being modulated corresponding to image information by the optical scanning apparatus, which is a latent image forming unit, to form the electrostatic latent image. The basic configuration of the optical scanning apparatus 113 that performs this exposure process is as explained in the first embodiment, and four optical scanning apparatuses can be arranged correspondingly to the respective photosensitive drums 111Y, 111M, 111C, and 111K. However, in the example in FIG. 11, the optical scanning apparatus has a configuration in which four-system multi beams are distributed by one deflector to perform scanning. That is, the optical scanning apparatus shown in FIG. 11 includes a multi-beam light source and first and second optical systems for four systems for respectively corresponding to the four photosensitive drums 111Y, 111M, 111C, and 111K. In the optical scanning apparatus, four-system multi beams are distributed into left and right by one deflector to scan, and optical paths of the respective multi beams are bent by a mirror provided on the second optical system and irradiated onto the respective photosensitive drums 111Y, 111M, 111C, and 111K.

The electrostatic latent image formed on the respective photosensitive drums 111Y, 111M, 111C, and 111K are developed by the yellow (Y) development apparatus 114Y, magenta (M) development apparatus 114M, cyan development apparatus 114C, and black (K) development apparatus 114K, and manifested as toner images of the respective colors of yellow (Y), magenta (M), cyan (C), and black (K). The sheet recording medium S is fed one by one from the paper feed cassette 119 by the paper feed roller 120 and the separation roller pair 121, with the timing matched with the development process, to reach the registration roller pair 123 via the carrier roller pair 122. The sheet recording medium S is sent out to the transfer belt 118 by the registration roller pair 123, matched with the timing when the toner images on the respective photosensitive drums 111Y, 111M, 111C, and 111K manifested in the above development process reach the transfer position, and the sheet recording medium S is sequentially carried to the transfer position for the respective colors by the transfer belt 118. A transfer bias is applied by the transfer apparatuses 115Y, 115M, 115C, and 115K arranged opposite to the respective photosensitive drums 111Y, 111M, 111C, and 111K, putting the transfer belt 118 therebetween, and the toner image of the respective colors on the respective photosensitive drums 111Y, 111M, 111C, and 111K are sequentially superposed on and transferred to the sheet recording medium S. The four-color superposed toner image (color image) transferred onto the sheet recording medium S is fixed by applying the heat and the pressure by the fuser 117. The sheet recording medium S on which the toner image is fixed is ejected to the paper ejector (not shown) outside of the apparatus. The respective photosensitive drums 111Y, 111M, 111C, and 111K after the transfer of the toner image are cleaned by the cleaning member (the blade, the brush, and the like) in the cleaning apparatuses 116Y, 116M, 116C, and 116K to remove the residual toner and the paper dust.

The image forming apparatus shown in FIG. 11 has a single-color mode in which a single-color image of any one of yellow (Y), magenta (M), cyan (C), and black (K) is formed, a two-color mode in which a two-color image of any two colors of yellow (Y), magenta (M), cyan (C), and black (K) is formed by superposing the two colors, a three-color mode in which a three-color image of image of any three colors of yellow (Y), magenta (M), cyan (C), and black (K) is formed by superposing the three colors, and a full color mode in which a four-color superposed image is formed in the above manner. In the image forming apparatus, the single-color, multicolor, and full-color images can be formed by specifying one of these modes on an operating unit (not shown) to execute the operation.

In the image forming apparatus having the configuration shown in FIG. 11, a multicolor image is formed on the sheet recording medium S through processes of charging, exposure, development, and transfer by imaging units for respective colors. However, an intermediate-transfer type image forming apparatus having such a configuration that an intermediate transfer body such as an intermediate transfer belt is used, to form a respective color-superposed image by primarily transferring the respective color toner images from the respective photosensitive drums 111Y, 111M, 111C, and 111K, and then the superposed images are batch-transferred secondarily from the intermediate transfer body to the sheet recording medium S can be used, instead of the direct transfer method for directly transferring the image from the respective photosensitive drums 111Y, 111M, 111C, and 111K to the sheet recording medium S.

In the multicolor image forming apparatus according to the present invention, a multicolor image is formed on the sheet recording medium S through processes of charging, exposure, development, and transfer by the imaging units for respective colors. However, by using the optical scanning apparatus explained in the first embodiment as the optical scanning apparatus 113, the image forming apparatus that can handle high density, high speed, and multicolor can be realized.

Specific examples (optical system data) of the optical scanning apparatus according to the present invention are shown below.

The arrangement of the optical system in the optical scanning apparatus is as shown in FIG. 1. The wavelength of the respective light emitting elements in the light source 1 is 780 nanometers, and a plurality of light emitting elements is arranged two dimensionally as shown in FIG. 2.

The diameter of the light emitting area (the white circles in FIG. 2) is 4 micrometers, and as described above, arranged in 4×8 arrays, where the device interval (pitch) d in the sub scanning direction is 18.4 micrometers, and the device interval (pitch) X in the main scanning direction is 30 micrometers.

The both first and second surfaces of the coupling lens 2 in the first optical system have a surface shape expressed by the following Equation (1):

$$x = (h^2/R)/[1+\sqrt{\{1-(1+K)(h/R)^2\}}] + A4 \cdot h^4 + A6 \cdot h^6 + A8 \cdot h^8 + A10 \cdot h^{10} \quad (1)$$

When it is assumed that the distance from the optical axis is h, paraxial radius of curvature is R, conical constant is K, and higher-order coefficients are A4, A6, A8, and A10, the respective coefficients are as shown below. Refractive index is 1.5119.

Respective Coefficients of First Surface
 R=98.97
 K=−18.9
 A4=−2.748510E-06 (E-06 stands for $10^{-6}$)
 A6=7.513797E-07
 A8=−5.817478E-08
 A10=−2.475370E-09

Respective Coefficients of Second Surface
 R=−31.07
 K=−0.35
 A4=1.210E-06
 A6=6.782E-08
 A8=2.523E-08
 A10=−0.4670E-09 d1 in FIG. 1 is 42.39 millimeters and a cover glass having a refractive index of 1.5112 and a thickness of 0.3 millimeter is inserted therein. Further, d2 is 3.8 millimeters.

The first surface of the anamorphic lens 4 has a cylindrical surface having a power in the sub scanning direction and the second surface thereof is a cylindrical surface having a power in the main scanning direction. The radius of curvature in vertical scanning of the first surface is 55 millimeters, and the radius of curvature in horizontal scanning of the second surface is −500 millimeters. In FIG. 1, d3 is 117.2 millimeters, and d4 is 3 millimeters.

The aperture 3 is arranged at a position 58.2 millimeters away from the second surface of the anamorphic lens 4 toward the deflector side, and on the side close to the polygon mirror (the optical deflector) 5 than the rear focal point of the coupling lens 2. d5 is 120.2 millimeters. The aperture has a diameter of a rectangular shape of 5.5 millimeters in the main scanning direction and 1.18 millimeters in the sub scanning direction.

At this time, the soundproof glass 10 having a thickness of 1.9 millimeters and a refractive index of 1.5112 is arranged between the anamorphic lens 4 and the polygon mirror 5, and the polygon mirror 5 and the scanning lens 6. The polygon mirror 5 has four surfaces and a radius of inscribed circle is 7 millimeters.

Further, in FIG. 1, d6 is 36.7 millimeters, d7 is 8 millimeters, d8 is 101.9 millimeters, d9 is 3 millimeters, and d10 is 138.2 millimeters. The optical system data after the polygon mirror (the optical deflector) 5 is shown in Table 2 below.

TABLE 2

|  | Rm | Rs | D | n |
|---|---|---|---|---|
| Optical deflector (Rotation axis) | — | — | 36.7 | — |
| Scanning lens 6 (First surface) | −110.142 | −472.788 | 8.0 | 1.524 |
| Scanning lens 6 (Second surface) | −57.939 | −500.0 | 101.9 |  |
| Scanning lens 7 (First surface) | −5000.0 | 93.8 | 3.0 | 1.524 |
| Scanning lens 7 (Second surface) | 724.16 | −60.71 | 138.2 |  |
| Surface to be scanned | — | — | — | — |

In Table 2, $R_m$ denotes "paraxial curvature in the main scanning direction", $R_s$, denotes "paraxial curvature in the sub scanning direction", and D denotes a distance between the optical devices. The unit is millimeters. Further, the dustproof glass is arranged between the image-surface side scanning lens 7 and the surface 9 to be scanned, and the dustproof glass 8 has a refractive index of 1.5112 and a thickness of 1.9 millimeters.

The respective surfaces of the deflector side scanning lens 6 and the image-surface side scanning lens 7 forming the second optical system are aspheric surfaces. The whole surfaces are special surfaces having a "noncircular arc shape provided by the following Equation (2) in the main scanning direction", in which a curvature in the vertical scanning cross section (a virtual cross section parallel to the optical axis and the sub scanning direction) changes according to the following Equation (3) in the main scanning direction.

That is, when it is assumed that the paraxial radius of curvature of the optical axis in the horizontal scanning surface is $R_m$, the distance from the optical axis in the main scanning direction is Y, the conical constant is K, and higher-order coefficients are $A_1, A_2, A_3, A_4, A_5, A_6, \ldots$, the noncircular arc shape in the horizontal scanning surface (a virtual plane cross section including a lens optical axis and parallel to the main scanning direction) is expressed by a polynomial using a depth: X in the direction of the optical axis:

$$X = (Y^2/Rm)/[1+\sqrt{\{1-(1+K)(y/Rm)^2\}}] + A_1 \cdot Y + A_2 \cdot Y^2 + A_3 \cdot Y^3 + A_4 \cdot Y^4 + A_5 \cdot Y^5 + A_6 \cdot Y^6 \quad (2)$$

When one or more of odd-order coefficients $A_1, A_3, A_5, \ldots$ are not "0", the noncircular arc shape provided by Equation (2) becomes asymmetric in the main scanning direction.

An equation expressing the state where the curvature in the vertical scanning cross section: $C_s(Y)$ (Y: a coordinate in the main scanning direction, designating an optical axis position as an origin) changes in the main scanning direction is as follows, designating the radius of curvature in the vertical scanning cross section including the optical axis as coefficients $B_1, B_2, B_3, \ldots$:

$$Cs(Y) = \{1/Rs(0)\} + B_1 \cdot Y + B_2 \cdot Y^2 + B_3 \cdot Y^3 + B_4 \cdot Y^4 + B_5 \cdot Y^5 \qquad (3)$$

When one or more of odd-order coefficients $B_1, B_3, B_5, \ldots$ are not "0", the "curvature in the vertical scanning cross section" provided by Equation (3) changes asymmetrically in the main scanning direction.

Coefficients of the first surface (incident surface (special surface)) of the deflector side scanning lens 6 are shown in Table 3. Coefficients of the second surface (emitting surface (special surface)) of the deflector side scanning lens 6 are shown in Table 4. Further, coefficients of the first surface (incident surface (special surface)) of the image-surface side scanning lens 7 are shown in Table 5, and coefficients of the second surface (emitting surface (special surface)) of the image-surface side scanning lens 7 are shown in Table 6.

TABLE 3

| Coefficient in main scanning direction | | Coefficient in sub scanning direction | |
|---|---|---|---|
| K | 0.000000+00 | $B_1$ | 0 |
| $A_4$ | $-3.87482 \times 10^{-7}$ | $B_4$ | 0 |
| $A_6$ | $6.88714 \times 10^{-10}$ | $B_3$ | 0 |
| $A_8$ | $-3.02912 \times 10^{-13}$ | $B_4$ | 0 |
| $A_{10}$ | $-1.381964 \times 10^{-16}$ | $B_5$ | 0 |
| $A_{12}$ | $4.973160 \times 10^{-20}$ | $B_6$ | 0 |
| — | | $B_7$ | 0 |
| — | | $B_8$ | 0 |

TABLE 4

| Coefficient in main scanning direction | | Coefficient in sub scanning direction | |
|---|---|---|---|
| K | 0.000000+00 | $B_1$ | $6.44465 \times 10^{-6}$ |
| $A_4$ | $1.46716 \times 10^{-7}$ | $B_4$ | $-2.76702 \times 10^{-6}$ |
| $A_6$ | $2.24364 \times 10^{-10}$ | $B_3$ | $-1.17939 \times 10^{-8}$ |
| $A_8$ | $-1.24578 \times 10^{-14}$ | $B_4$ | $-7.27004 \times 10^{-9}$ |
| $A_{10}$ | $5.54989 \times 10^{-18}$ | $B_5$ | $3.89316 \times 10^{-11}$ |
| $A_{12}$ | $-8.15818 \times 10^{-20}$ | $B_6$ | $-5.12653 \times 10^{-12}$ |
| — | | $B_7$ | $-3.86625 \times 10^{14}$ |
| — | | $B_8$ | $1.12285 \times 10^{-14}$ |

TABLE 5

| Coefficient in main scanning direction | | Coefficient in sub scanning direction | |
|---|---|---|---|
| K | 0.000000+00 | $B_1$ | $4.98759 \times 10^{-7}$ |
| $A_4$ | $9.47700 \times 10^{-8}$ | $B_4$ | $-9.40784 \times 10^{-7}$ |
| $A_6$ | $-7.06270 \times 10^{-12}$ | $B_3$ | $5.11005 \times 10^{-11}$ |
| $A_8$ | $1.70056 \times 10^{-16}$ | $B_4$ | $7.50683 \times 10^{-11}$ |
| $A_{10}$ | $-6.11408 \times 10^{-20}$ | $B_5$ | $-5.15221 \times 10^{-15}$ |
| $A_{12}$ | $3.00776 \times 10^{-24}$ | $B_6$ | $-4.81012 \times 10^{-15}$ |
| — | | $B_7$ | $-1.46189 \times 10^{-19}$ |
| — | | $B_8$ | $7.21434 \times 10^{-19}$ |
| | | $B_9$ | $2.22208 \times 10^{-23}$ |
| | | $B_{10}$ | $-2.53749 \times 10^{-23}$ |

TABLE 6

| Coefficient in main scanning direction | | Coefficient in sub scanning direction | |
|---|---|---|---|
| K | 0.000000+00 | $B_1$ | 0 |
| $A_4$ | $-5.56255 \times 10^{-8}$ | $B_4$ | $2.09875 \times 10^7$ |
| $A_6$ | $5.42541 \times 10^{-12}$ | $B_3$ | 0 |
| $A_8$ | $-6.15064 \times 10^{-16}$ | $B_4$ | 0 |
| $A_{10}$ | $-2.44542 \times 10^{-20}$ | $B_5$ | 0 |
| $A_{12}$ | $1.73451 \times 10^{-24}$ | $B_6$ | 0 |

TABLE 6-continued

| Coefficient in main scanning direction | | Coefficient in sub scanning direction | |
|---|---|---|---|
| — | | $B_7$ | 0 |
| — | | $B_8$ | 0 |

Figure 12:
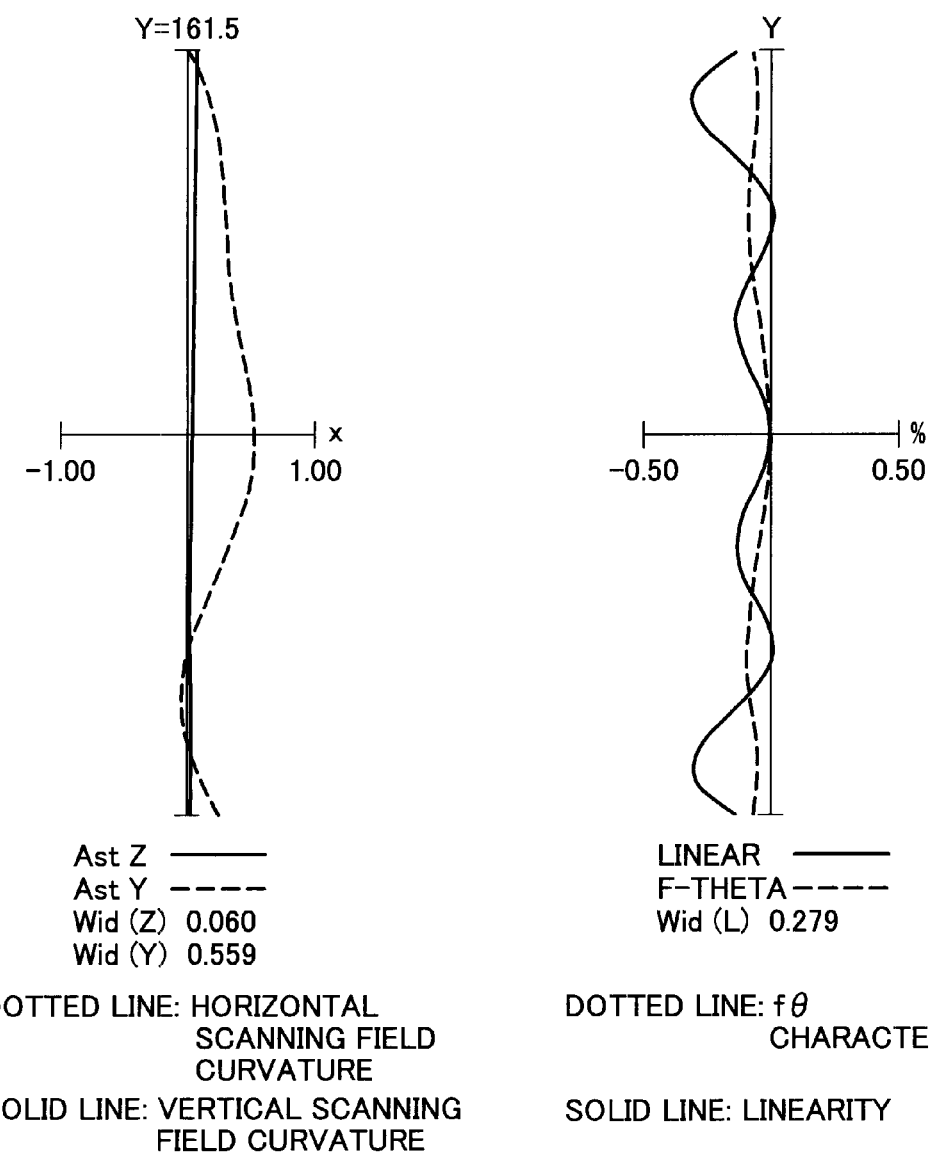
FIG. 12 is an aberration diagram of an optical scanning apparatus according to another embodiment of the present invention.

An aberration diagram of the optical scanning apparatus in this example is shown in FIG. 12, in which aberration is corrected favorably. Further, the beam spot diameter on the image surface (surface to be scanned) 9 becomes as shown in Table 7 below, which is corrected favorably.

At this time, the absolute value $|\beta m|$ of lateral magnification in the main scanning direction becomes 4.9, and the absolute value $|\beta s|$ of lateral magnification in the sub scanning direction becomes 2.3, thereby obtaining a scanning line interval of 5.3 micrometers on the surface to be scanned. Accordingly, the optical scanning apparatus can be applied to the image forming apparatus that can handle high density and high speed, as the optical scanning apparatus having a high density of 4800 dpi.

TABLE 7

| Image height (mm) | Horizontal scanning (μm) | Vertical scanning (μm) |
|---|---|---|
| −161.5 | 54.12 | 56.48 |
| −150 | 53.49 | 55.90 |
| −100 | 53.54 | 55.65 |
| −50 | 52.80 | 54.71 |
| 0 | 52.33 | 54.08 |
| 50 | 52.86 | 54.73 |
| 100 | 53.51 | 55.67 |
| 150 | 53.38 | 55.88 |
| 161.5 | 54.24 | 56.46 |

Accordingly, handling of the high density becomes easy by making the distance between the outermost light emitting elements in the main scanning direction longer than that in the sub scanning direction.

Accordingly, handling of the high density becomes easy by making the distance between the outermost light sources in the main scanning direction longer than that in the sub scanning direction, and because the anamorphic lens has positive power in the main scanning direction, the distance between the outermost beams on the polygon mirror face becomes short, and therefore favorable optical characteristic can be obtained in both the horizontal scanning and sub scanning directions.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An optical scanning apparatus comprising:
    a light source including a two-dimensional array of light emitting elements, each light emitting element configured to emit a light beam, and the two-dimensional array being provided on a plane that corresponds to a plane composed of an axis corresponding to a main scanning direction and an axis corresponding to a sub scanning direction;
    a first optical system that leads the light beams emitted from the light source to a deflector; and a second optical system that leads the light beams deflected from the deflector to a surface to be scanned, wherein
a scanning direction of the light beams deflected from the deflector is the main scanning direction,
a direction orthogonal to the main scanning direction is the sub scanning direction, and
a distance between outermost of the light emitting elements in the main scanning direction is longer than that in the sub scanning direction.

2. The optical scanning apparatus according to claim 1, wherein, when lateral magnification in the main scanning direction of an optical system between the light source and the surface to be scanned is βm, and lateral magnification in the sub scanning direction of an optical system between the light source and the surface to be scanned is βs, then |βm|>|βs|.

3. The optical scanning apparatus according to claim 1, wherein
in the light source, m (m≧2) light emitting elements are arranged along the sub scanning direction and n (n≧2, m≦n) light emitting elements are arranged substantially in the main scanning direction, and
the light emitting elements are arranged at a first equal interval in the sub scanning direction, two adjacent light emitting elements in the main scanning direction are displaced by a second equal interval in the sub scanning direction, and the light emitting elements are arranged at a third equal interval in the main scanning direction.

4. The optical scanning apparatus according to claim 3, wherein, in the light source, when the first equal interval is d and the third equal interval is X, then X>d.

5. The optical scanning apparatus according to claim 1, wherein the first optical system includes a coupling lens that couples the light beams emitted from the light source, and an aperture that limits the beams at least in the main scanning direction relative to the light beams emitted from the coupling lens, and the aperture is arranged at a position closer to the deflector rather than at a rear focal position of the coupling lens.

6. The optical scanning apparatus according to claim 1, wherein at least one of the outermost light emitting elements has higher light emitting amount than any other of the light emitting elements.

7. The optical scanning apparatus according to claim 1, wherein the first optical system includes a coupling lens that couples the light beams emitted from the light source, and an aperture that limits the beams in the main scanning direction and the sub scanning direction, and a width of the aperture in the main scanning direction is larger than that in the sub scanning direction.

8. An image forming apparatus that forms images by using the optical scanning apparatus according to claim 1.

9. An image forming apparatus that forms multicolor images by using the optical scanning apparatus according to claim 1.

10. An optical scanning apparatus comprising:
a light source including a two-dimensional array of light emitting elements, each light emitting element configured to emit a light beam, the two-dimensional array being provided on a plane that corresponds to a plant composed of an axis corresponding to a main scanning direction and an axis corresponding to a sub scanning direction;
a first optical system that leads the light beams emitted from the light source to a deflector; and
a second optical system that leads the light beams deflected from the deflector to a surface to be scanned, wherein
the first optical system includes
a coupling lens that couples the light beams emitted from the light source, and
an anamorphic lens that converts the light beams from the coupling lens in a line image extending in the main scanning direction;
a distance between outermost of the light emitting elements in the main scanning direction is longer than that in the sub scanning direction, and
the anamorphic lens has a positive power in the main scanning direction.

11. The optical scanning apparatus according to claim 10, wherein the first optical system includes a coupling lens that couples the light beams emitted from the light source, and an aperture that limits the beams in the main scanning direction and the sub scanning direction, and a width of the aperture in the main scanning direction is larger than that in the sub scanning direction.

12. The optical scanning apparatus according to claim 10, wherein at least one of the outermost light emitting diodes has higher light emitting amount than any other of the light emitting diodes.

13. An image forming apparatus that forms images by using the optical scanning apparatus according to claim 10.

14. An image forming apparatus that forms multicolor images by using the optical scanning apparatus according to claim 10.

15. An optical scanning apparatus comprising:
a light source including a two-dimensional array of light emitting elements, each light emitting element configured to emit a light beam, the two-dimensional array being provided on a plane that corresponds to a plane composed of an axis corresponding to a main scanning direction and an axis corresponding to a sub scanning direction;
a first optical system that leads the light beams emitted from the light source to a deflector; and
a second optical system that leads the light beams deflected from the deflector to a surface to be scanned, wherein
a distance between outermost of the light emitting elements in the main scanning direction is longer than that in the sub scanning direction,
the first optical system includes
a coupling lens that couples the light beams emitted from the light source, and
an aperture that limits the optical beams emitted from the coupling lens in both the main scanning direction and the sub scanning direction; and
a width of the aperture in the main scanning direction is larger than that in the sub scanning direction.

16. The optical scanning apparatus according to claim 15, wherein at least one of the outermost light emitting elements has higher light emitting amount than any other of the light emitting diodes.

17. An image forming apparatus that forms images by using the optical scanning apparatus according to claim 15.

18. An image forming apparatus that forms multicolor images by using the optical scanning apparatus according to claim 15.

* * * * *